(12) United States Patent
Tanabe

(10) Patent No.: US 6,724,259 B2
(45) Date of Patent: Apr. 20, 2004

(54) VARIABLE GAIN AMPLIFIER

(75) Inventor: Mitsuru Tanabe, Katano (JP)

(73) Assignee: Matsushita Electric Industrial Co., Ltd. (JP)

( * ) Notice: Subject to any disclaimer, the term of this patent is extended or adjusted under 35 U.S.C. 154(b) by 15 days.

(21) Appl. No.: 10/144,728

(22) Filed: May 15, 2002

(65) Prior Publication Data

US 2002/0171493 A1 Nov. 21, 2002

(30) Foreign Application Priority Data

May 18, 2001 (JP) ........................................ 2001-148549

(51) Int. Cl.[7] ................................................ H03G 3/30
(52) U.S. Cl. ........................ 330/285; 330/51; 330/278; 330/311
(58) Field of Search ........................... 330/51, 278, 285, 330/311, 254

(56) References Cited

U.S. PATENT DOCUMENTS 5,999,056 A * 12/1999 Fong ........................... 330/278
6,392,487 B1 * 5/2002 Alexanian ..................... 330/254
6,404,283 B1 * 6/2002 Lau et al. ....................... 330/51

OTHER PUBLICATIONS

1999 IEEE International Solid–State Circuits Conference, by Keng Leong Fong. "Dual–Band High–Linearity Variable–Gain Low–Noise Amplifiers for Wireless Applications", pp. 224–225 and 463.

* cited by examiner

*Primary Examiner*—Khanh Van Nguyen
(74) *Attorney, Agent, or Firm*—Parkhurst & Wendel, L.L.P.

(57) ABSTRACT

It is an object of the present invention to provide a variable gain amplifier of which impedance does not change when gains are switched. A transistor is turned on in a high-gain state and transistors are turned on in a low-gain state to switch between the gains, the area of the transistor is made equal to the area of the transistor to keep the same output load conditions and the same output impedance both in the high-gain state and the low-gain state. While the input impedance of a transistor becomes high because the transistor in a high-gain path is turned off in the low-gain mode, current passes through a transistor to lower the impedance of the collector of a transistor and, as a result, the input impedance is kept the same both in the high-gain state and the low-gain state.

5 Claims, 7 Drawing Sheets

$Z_H$: HIGH-GAIN IMPEDANCE AT 1GHz   $Z_{HH}$: HIGH-GAIN IMPEDANCE AT 5GHz $Z_L$: LOW-GAIN IMPEDANCE AT 1GHz   $Z_{LL}$: LOW-GAIN IMPEDANCE AT 5GHz

VARIABLE GAIN AMPLIFIER

FIELD OF THE INVENTION

The present invention relates to a variable gain amplifier for radio-frequency signals.

BACKGROUND OF THE INVENTION

FIGS. 6 and 7 show prior-art variable gain amplifiers.

In the variable gain amplifier shown in FIG. 6, an input signal, $RF_{in}$, to be amplified is applied to the base of an common emitter transistor 101 through an input terminal 200 and, in a high-gain state, a bias voltage is applied to a common base transistor 102 from a bias power supply 204 through a contact 202 of a selector switch 201. As a result, a power supply voltage is applied to the collector of the transistor 101 from a power supply 205 through load Z and the collector-emitter of the transistor 102. Reference number 206 indicates a bias power supply, which generates a bias voltage determining the operating point of the transistor 101.

The signal, which is amplified by amplification factor found by transconductance gm of the transistor 101 that determines current flowing in load Z and magnitude of the load Z, is provided from an output terminal 208 connected to the connecting point 207 between load Z and the transistor 102.

In a low-gain state, a bias voltage is applied to the transistor 102 from the power supply 204 through a contact 203 of the selector switch 201. As a result, current between the collector and emitter of the transistor 102 is turned off and current between the collector and emitter of the common base transistor 103 is turned on and thereby a power supply voltage is applied to the collector of the transistor 101 from the power supply 205 through load Z, a resistor 104, and the collector-emitter of the transistor 103. The signal, which is amplified by amplification factor found by transconductance gm of the transistor 101 that determines current flowing in load Z and magnitude of the load Z, is provided from the output terminal 208, as in the high-gain state. A gain lower than that in the high-gain state is set by the resistor 104.

In the variable gain amplifier shown in FIG. 7, the gain is changed as follows.

Operation of this variable gain amplifier in a high-gain state is the same as that of the variable gain amplifier shown in FIG. 6. In a low-gain state, a bias voltage is applied to the base of a common base transistor 105 from a bias power supply 204 through a contact of a selector switch 201, current between the collector and emitter of the transistor 102 is turned off, and current between the collector and emitter of the transistor 105 is turned on and thereby a power supply voltage is applied to the collector of a transistor 101 from the power supply 205 through the collector-emitter of the transistor 105. A signal, which is amplified by amplification factor found by transconductance gm of the transistor 101 that determines current flowing in load Z and magnitude of the load Z, is coupled to the connecting point 207 at radio frequency through junction capacitance Cj, which is determined by the isolation property when current is turned off between the collector and emitter of the transistor 102, and provided through an output terminal 208 in a low-gain state.

An example of circuits in which a variable gain amplifier is used can be a first amplifier provided at the front end of a radio-frequency receiver. As shown in FIG. 8, bandpass filters 209 and 210 are connected to the input and output stages, respectively, of first amplifier A in order to improve selectivity. Reference number 211 indicates a mixer circuit.

Because the band-pass filters 209, 210 are designed to satisfy an required pass frequency property at certain input and output impedances, the gain of first amplifier A is switched between high-gain and low-gain states in accordance with electric field strength in a area in which the radio-frequency receiver is used.

Therefore, it is required that the certain input and output impedances of first amplifier A be maintained independently of the switching between high and low gain states.

However, in the prior-art variable gain amplifier shown in FIG. 6, the input and output impedances vary depending on the high-gain or low-gain states.

In particular, the output impedance at 1 GHz is not significantly changed on switching between the high-gain and low-gain state as indicated by symbols $Z_H$ and $Z_L$ on a Smith chart in FIG. 9. On the other hand, the output impedance at 5 GHz is significantly changed on switching between the high-gain and low-gain state as indicated by symbols $Z_{HH}$ and $Z_{LL}$.

In the prior-art variable gain amplifier shown in FIG. 7, the input and output impedances are changed on switching between the high-gain state and low-gain state, and in addition, the low gain is determined by the isolation property of the transistor 102 in the off-state and therefore cannot be controlled.

DISCLOSURE OF THE INVENTION

It is an object of the present invention to provide a variable gain circuit whose impedance does not significantly vary depending on a high- or low-gain state and whose gain can be freely set in the low-gain state.

According to aspect 1 of the present invention, there is provided a variable gain amplifier in which the output circuit of a second transistor 2 is provided between the output circuit of a first transistor and a load, and an input signal provided to the input of the first transistor is amplified, the amplified signal is taken from a connecting point between the load and the second transistor, and the second transistor is turned on and off to switch between gains, wherein: a series circuit of an attenuator means and an output circuit of a third transistor is connected in parallel with an output circuit of the second transistor; the output circuit of a fourth transistor is connected in parallel with a series circuit of the output circuit of the second transistor and the load; selector means is provided for switching between a high gain state and a low gain state; and the selector means turns off the third and fourth transistors and turns on the second transistor to take the signal, which is amplified by amplification factor found by transconductance gm of the first transistor that determines current flowing in load Z and magnitude of the load Z, from the connecting point in the high-gain state, and turns off the second transistor and turns on the third and fourth transistors to take the signal, which is amplified by amplification factor found by transconductance gm of the first transistor that determines current flowing in load Z and magnitude of the load Z, from the connecting point in the low-gain state.

According to aspect 2 of the present invention, the attenuator means in the variable gain amplifier according to aspect 1 is formed with a resistor or a parallel circuit of a resistor and a capacitor.

According to aspect 3 of the present invention, the attenuator means in the variable gain amplifier according to aspect 1 is formed with a field effect transistor.

According to aspect 4 of the present invention, there is provided a variable gain amplifier in which the output circuit of a second transistor 2 is provided between the output circuit of a first transistor and a load, and an input signal provided to the input of the first transistor is amplified, the amplified signal is taken from a connecting point between the load and the second transistor, and the second transistor is turned on and off to switch between gains, wherein: a series circuit of an attenuator means and an output circuit of a third transistor is connected in parallel with an output circuit of the second transistor; the output circuit of a fourth transistor is connected in parallel with a series circuit of the output circuit of the second transistor and the load; selector means is provided for switching a high gain state, a medium gain state, and a low gain state; the third, fourth, and fifth transistors are turned off and the second transistor is turned on to take the signal, which is amplified by amplification factor found by transconductance gm of the first transistor that determines current flowing in load Z and magnitude of the load Z, from the connecting point in the high-gain state; the second and fifth transistors are turned off and the third and fourth transistors are turned on to take the signal, which is amplified by amplification factor found by transconductance gm of the first transistor that determines current flowing in load Z and magnitude of the load Z, from the connecting point in the medium gain state; and the second and third transistors are turned off and the fourth and fifth transistors are turned on to take the signal, which is amplified by amplification factor found by transconductance gm of the first transistor that determines current flowing in load Z and magnitude of the load Z, from the connecting point in the low-gain state.

According to aspect 5 of the present invention, in the variable gain amplifier according to aspect 4, the fourth transistor of which the output circuit is connected in parallel with the series circuit of the output circuit of the second transistor and the load is formed with a first and second bypass transistors of which output circuits are connected in parallel with each other; a bias voltage of an input circuit of the third transistor is applied to an input circuit of the first bypass transistor through a resistor; and an input circuit of the second bypass circuit is connected to an input circuit of the fifth transistor.

DESCRIPTION OF THE EMBODIMENTS

Each embodiment according to the present invention will be described below based on FIGS. 1 to 5.

First Embodiment

Figure 1:
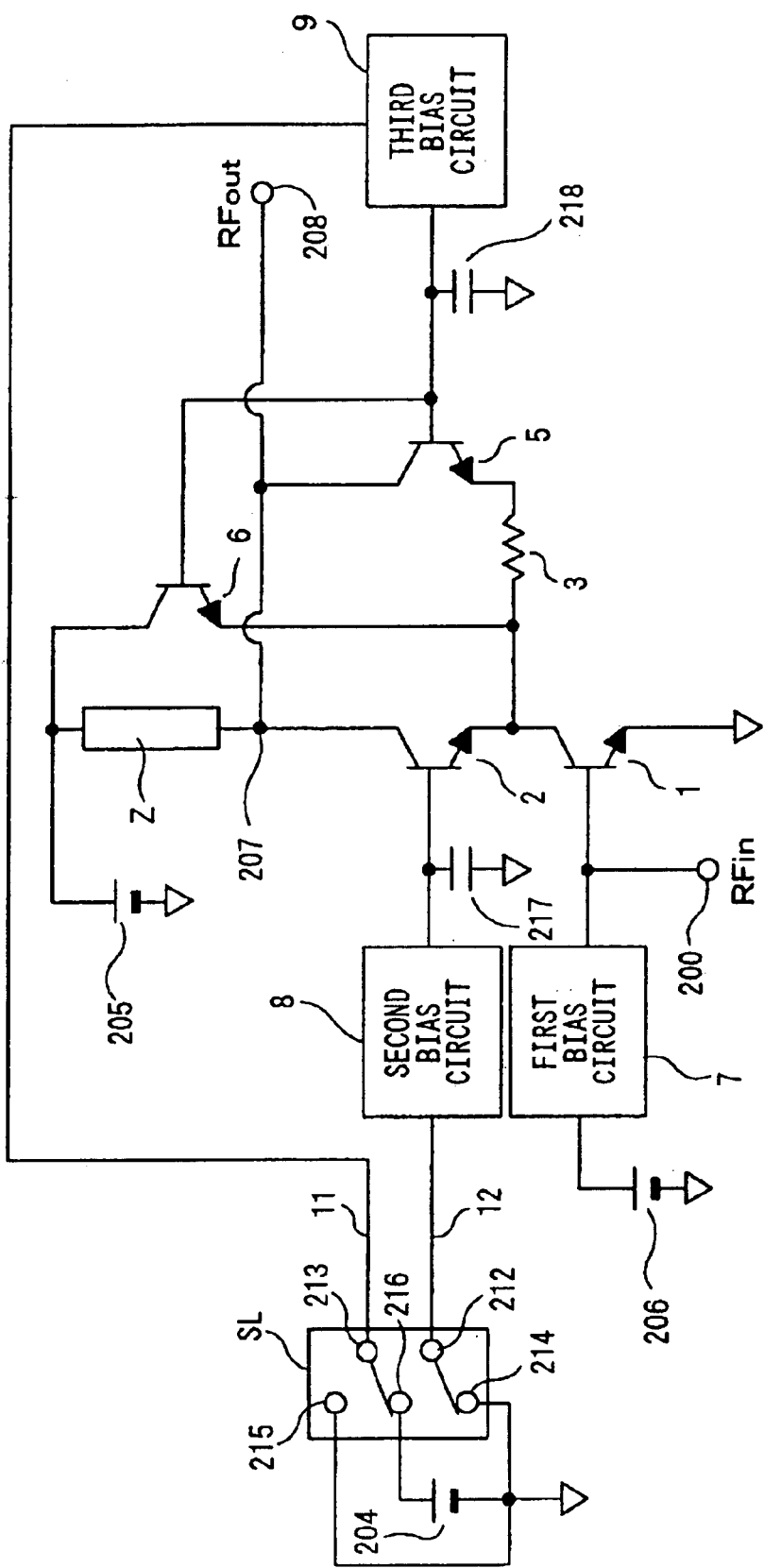
FIG. 1 is a schematic diagram of a variable gain amplifier according to a first embodiment of the present invention.

FIGS. 1 and 2 show a variable gain amplifier according to a first embodiment of the present invention.

As shown in FIG. 1, an input signal, $RF_{in}$, to be amplified is applied to an input terminal 200 and the signal amplified is taken through an output terminal 208. Switching between a high-gain state and low-gain state is performed by switching operation of selector means SL.

Input signal $RF_{in}$, inputted through the input terminal 200 is applied to the base of a first transistor 1. A bias voltage is applied to the base of the first transistor 1 from a bias power supply 206 through a first bias circuit 7.

The output circuit (C-E) of a second transistor 2 is provided between the output circuit (C-E) of the first transistor 1 and load Z. The base of the second transistor 2 is connected to a common contact 212 of the selector means SL through a second bias circuit 8.

A series circuit of a register 3 as an attenuator means and the output circuit of a third transistor 5 is connected in parallel between the collector and emitter of the second transistor 2.

The output circuit of a fourth transistor 6 is connected in parallel with a series circuit of the output circuit of the second transistor 2 and load Z. The bases of the third and fourth transistors 5, 6 are connected to a common contact 213 of the selector means SL through a third bias circuit 9. Reference numbers 217 and 218 indicate bypass capacitors, which are grounded at radio frequency.

Figure 2A:
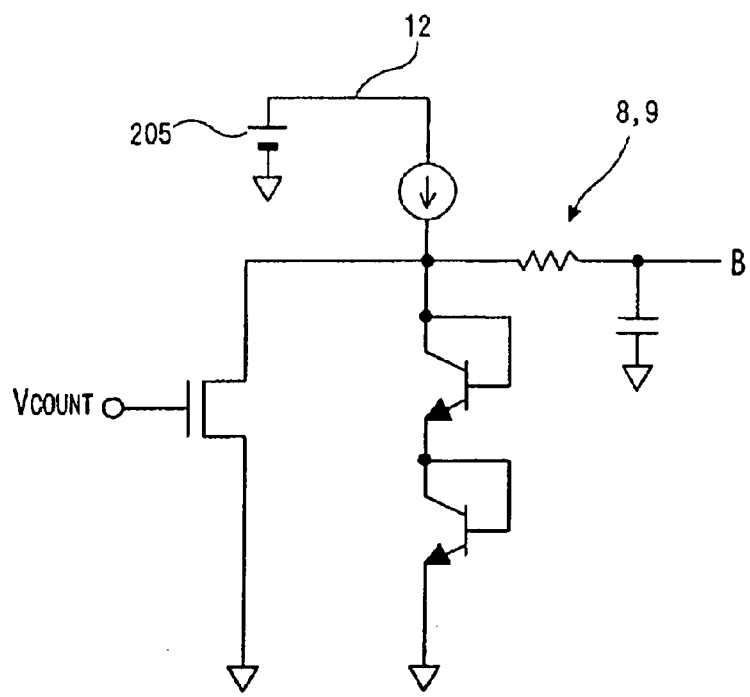
FIGS. 2a–2b are diagrams of a bias circuit according to the first embodiment.
Figure 2B:
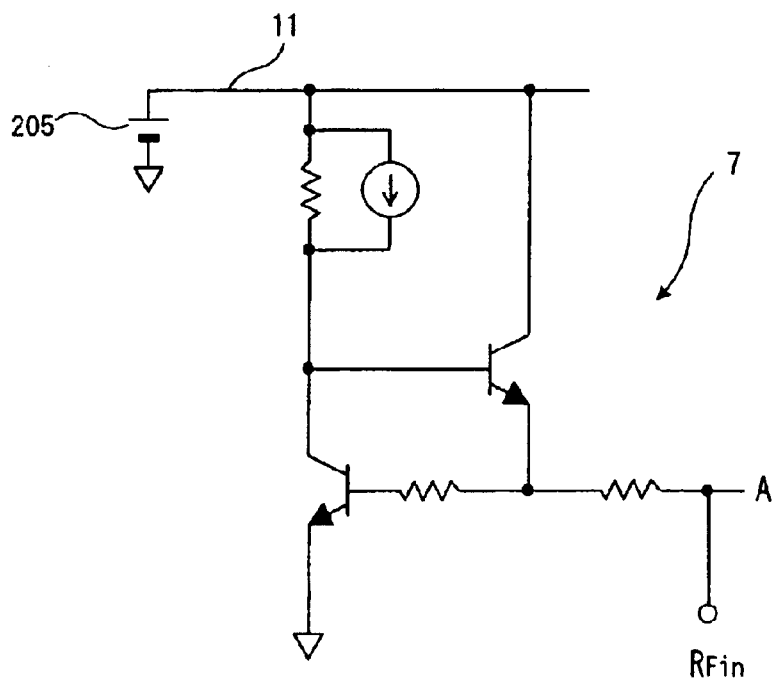

Contacts 214 and 215 of the selector means SL are grounded and a contact 216 is connected to a bias power supply 204. The first bias circuit 7 is formed with a mirror circuit as shown in FIG. 2b and the second bias circuit 8 is configured as shown in FIG. 2a. Reference number A indicates the output of the bias circuit 7, B indicates the output of the second bias circuit 8, 9, 12 indicates a line connecting to the input of the second bias circuit 8, and 11 indicates a line connecting to the input of the third bias circuit 9. The configuration of the third bias circuit 9 is similar to that of the second bias circuit 8.

Being configured as described above, in the high-gain state, the common contact 212 of the selector means SL is connected to the contact 216, the common contact 213 is connected to the contact 215, and the bias power supply 204 is connected to the base of the second transistor 2 through the second bias circuit 8. Because the input of the third bias circuit 9 is connected to a ground, the output circuits of the third and fourth transistors 5, 6 are in the off-state.

In this state, a power supply voltage from a power supply 205 is applied to the collector of the first transistor through the load Z and the output circuit which is in the on-state of the second transistor 2, and the signal, which is amplified by amplification factor found by transconductance gm of the first transistor 1 that determines current flowing in load Z and magnitude of the load, is provided to the output terminal 208 from the connecting point 207 through the output circuit which is in the on-state of the second transistor 2.

In the low-gain state, the common contact 212 of the selector means SL is connected to the contact 214, the common contact 213 is connected to the contact 216, the bias voltage to the bas of the second transistor 2 is turned off, and the bias power supply 204 is connected to the bases of the third and fourth transistors 5, 6 through the third bias circuit 9. Because the input of the second bias circuit 8 is connected to a ground, the output circuit of the second transistor is turned off.

In this state, the power supply voltage from the power supply 205 is applied to the collector of the first transistor 1 through the output circuit which is in the on-state of the fourth transistor 6. The signal, which is amplified by amplification factor found by transconductance gm of the first transistor that determines current flowing in load Z and magnitude of the load Z, is provided to the output terminal 208 through a resistor 3 and the output circuit which is in the on-state of the third transistor 5. Thus, the emitter potential of the third transistor 5 can be adjusted and any emitter-base voltage for the third transistor 5 can be set to control a gain by adjusting the resistance value of the resistor 3. Thus, the current which flows in LOAD Z is tuned by the resistor 3 and the gain can be controlled.

Variations in output impedance depending on the high or low gain state can be avoided by making the area of the second transistor 2 equal to the area of the third transistor 5 to provide the same output impedance conditions in both states. In particular, the total amount of base-collector capacitances of the common base transistors is made equal in both gain modes by making equal the sizes of the common base transistors used in low-gain and high-gain paths (providing a transistor structure in which the areas of the emitter, base, and collector are equal), thereby eliminating variations in impedance on the output side, which would otherwise be caused by on/off switching.

The second transistor 2 in the high-gain path is turned off in the low-gain state and, as a result, the input impedance of the second transistor 2 becomes high. However, current passes through the fourth transistor 6 and the impedance of the collector of the first transistor 1 is lowered. Therefore, the input impedance is kept the same both in the high-gain state and low-gain state.

Second Embodiment

Figure 3:
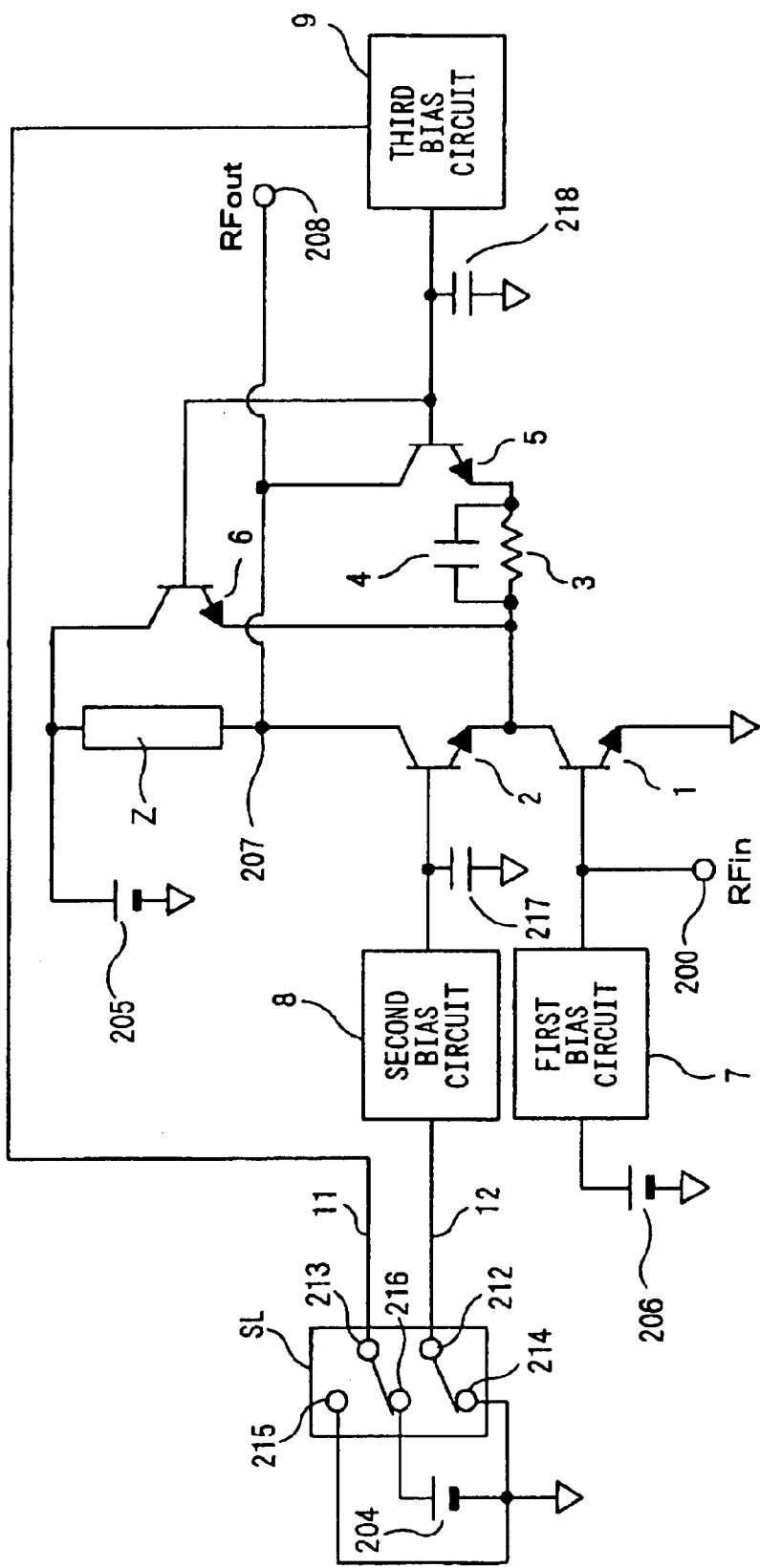
FIG. 3 is a variable gain amplifier according to a second embodiment o-f the present invention.

FIG. 3 shows a variable gain amplifier according to a second embodiment of the present invention, which is the same as the first embodiment shown in FIG. 1, except that a capacitor 4 is connected in parallel with a resister 3.

In this configuration, the collector potential of a first transistor 1 is determined by a forth transistor 6, the emitter potential of a third transistor 5 can be adjusted by adjusting the resistance value of the resister 3, and any base-emitter voltage of the third transistor 5 can be set in a low-gain state. Therefore, like the first embodiment, the gain can be controlled by the bias condition of the third transistor 5.

According to the second embodiment, attenuation of radio frequency power by the resistor 3 can be adjusted by adjusting the value of the capacitor 4. Thus, variations in attenuation by the register value of the resistor 3 can be moderated. Other features of the second embodiment are the same as those of the first embodiment.

Third Embodiment

Figure 4:
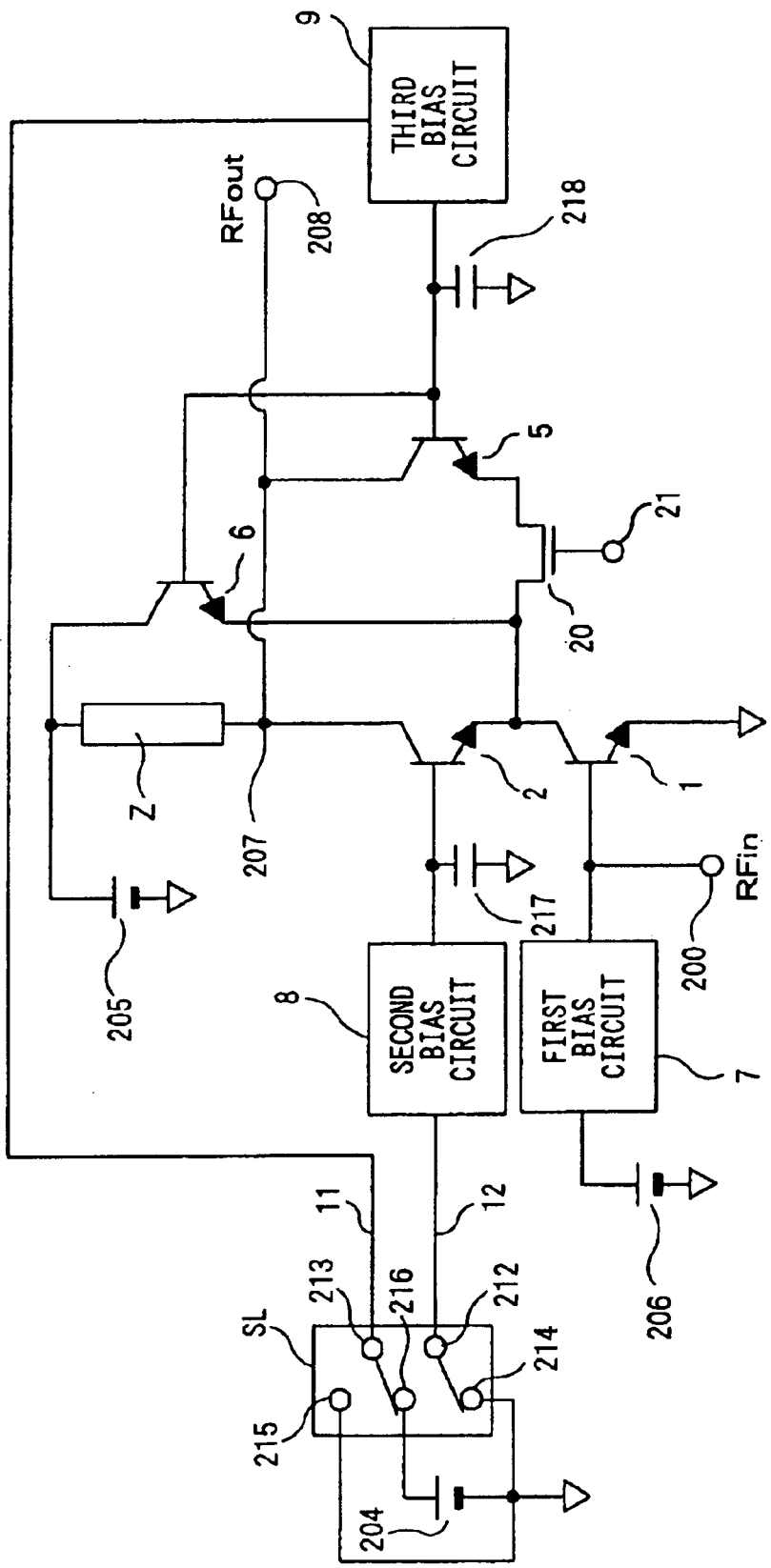
FIG. 4 is a schematic diagram of a variable gain amplifier according to a third embodiment.

FIG. 4 shows a variable gain amplifier according to a third embodiment of the present invention, which is the same as the first embodiment shown in FIG. 1, except that a MOS transistor 20 is provided in place of the resistor 3 in the first embodiment of the variable gain amplifier.

According to the third embodiment, the MOS transistor 20 attenuates power in a low-gain state. In particular, any gain can be set by adjusting the gate voltage 21 of the MOS transistor 20. Other features of the third embodiment are the same as those of the first embodiment.

Fourth Embodiment

Figure 5:
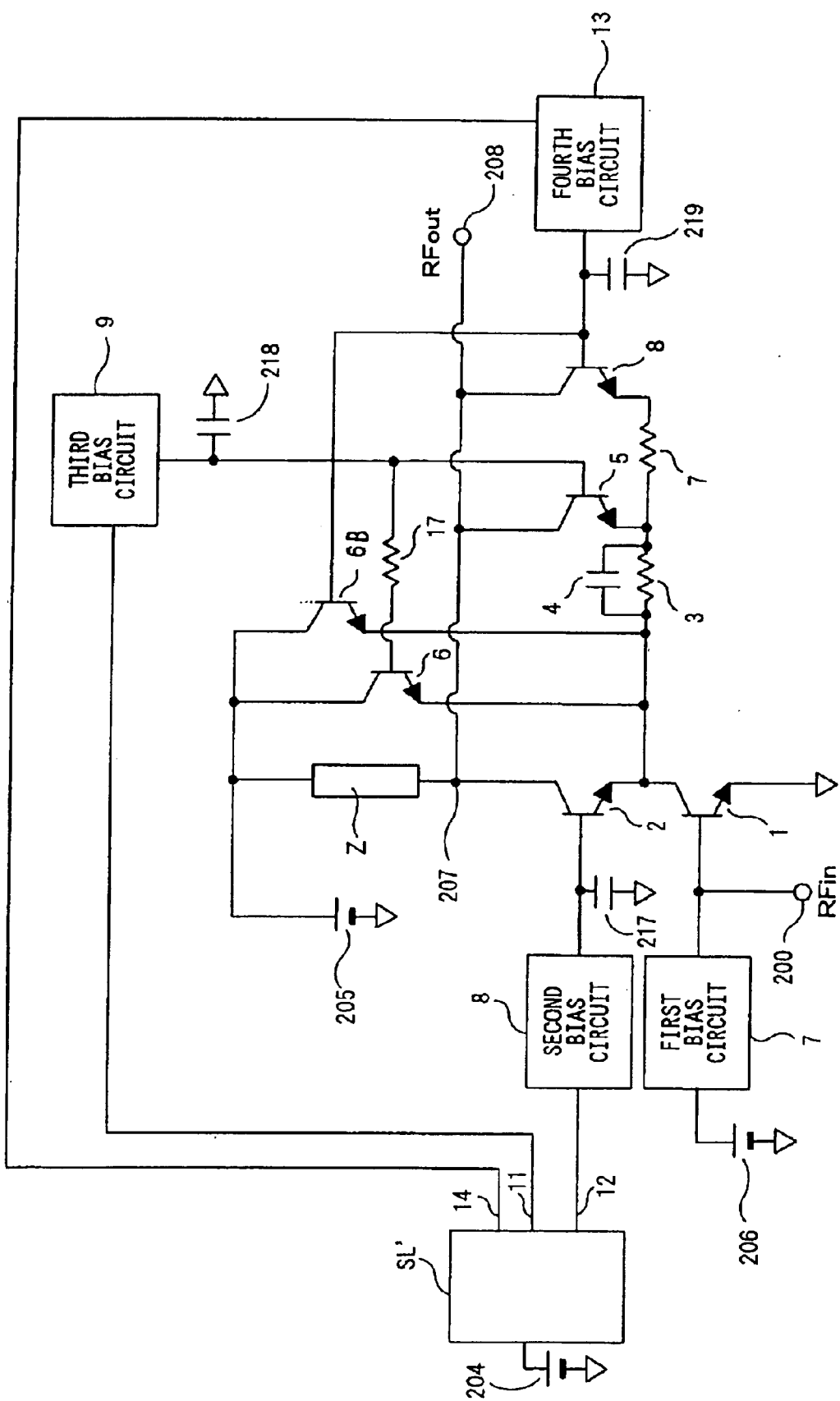
FIG. 5 is a schematic diagram of a variable gain amplifier according to a fourth embodiment of the present invention.
Figure 6:
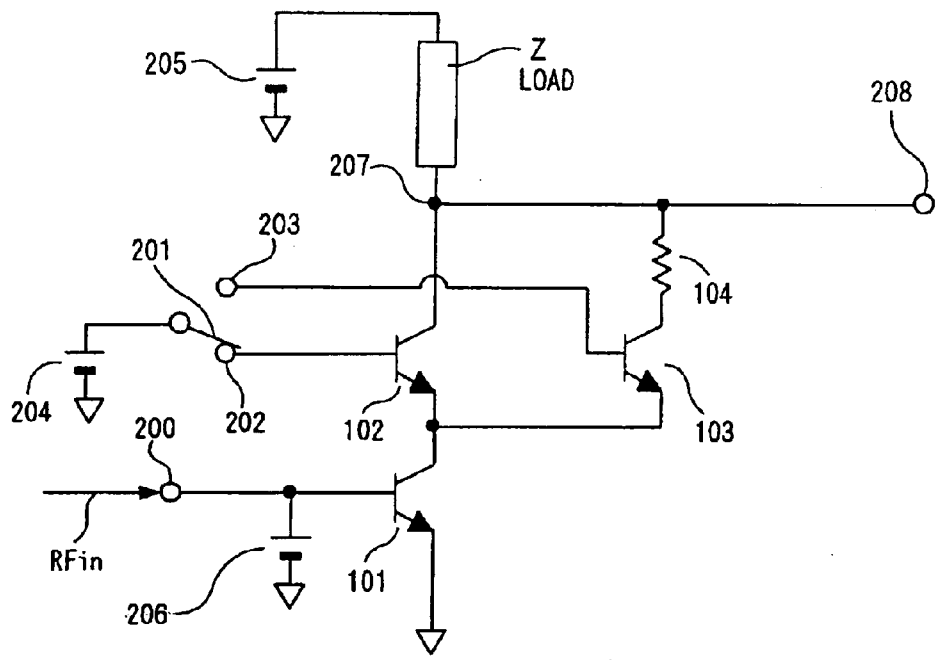
FIG. 6 is a schematic diagram of a variable gain amplifier according to a first prior art.
Figure 7:
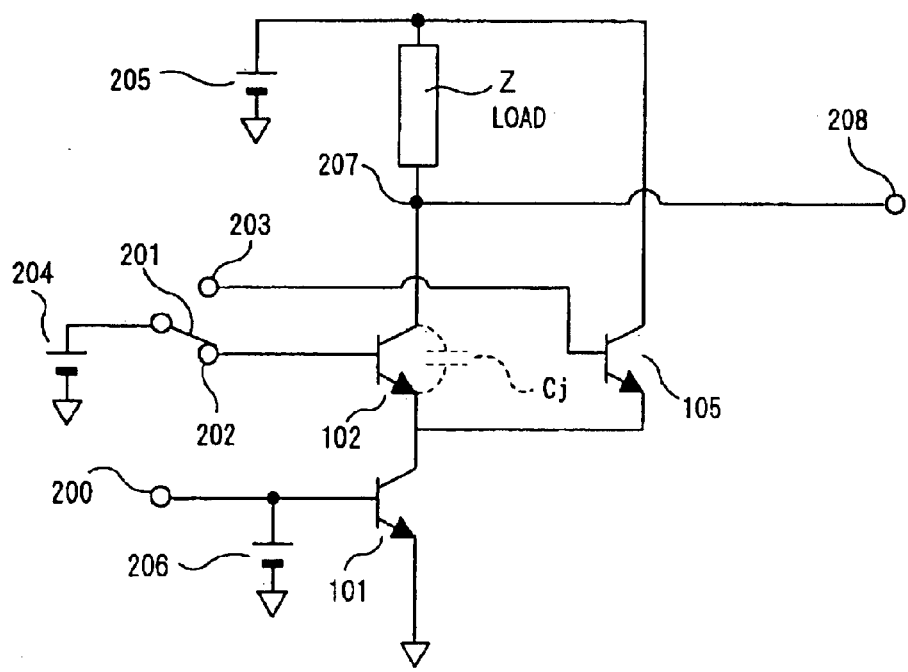
FIG. 7 is a schematic diagram of a variable gain amplifier according to a second prior art.
Figure 8:
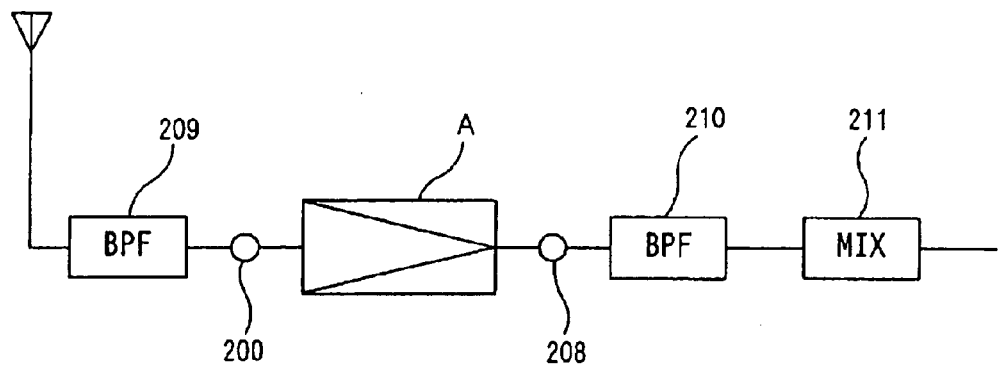
FIG. 8 is a block diagram of an application of the variable gain amplifier.
Figure 9:
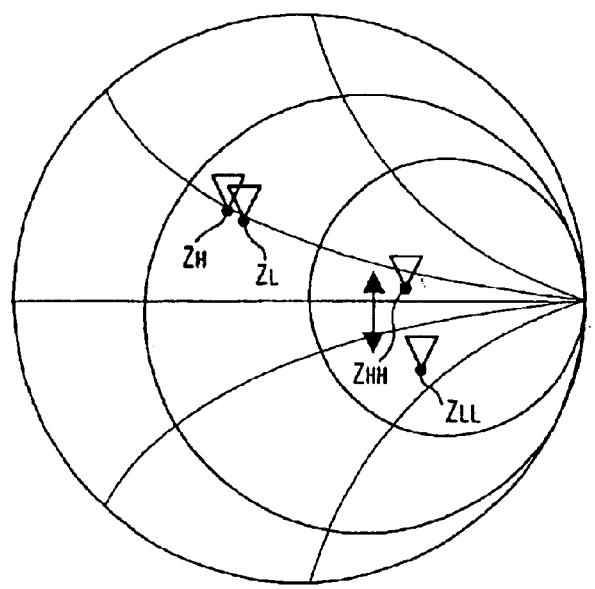
FIG. 9 is a Smith chart showing frequency characteristics of the first prior art.

FIG. 5 shows a variable gain amplifier according to a fourth embodiment of the present invention. The forth embodiment is the same as the second embodiment, except that the gain can be changed in three levels, that is, a high-gain state, medium-gain state, and low-gain state, and a series circuit of a transistor 8 and a resister 7, which is second attenuator means, is connected in parallel with the output circuit of the third transistor 5 of the second embodiment shown in FIG. 3.

In particular, the series circuit of the fifth transistor 8 and the resistor 7 as the second attenuator means is connected in parallel with the output circuit of the third transistor 5, the output circuit of a sixth transistor 6B is connected to the output circuit of a fourth transistor 6, and the base of the fifth transistor 8 and the base of the sixth transistor 6B are connected to selector means SL' through the fourth bias circuit 13 over a connection line 14.

The configuration of the selector means SL' will be described below.

In the high-gain state, a connection line 12 is connected to a bias power supply 204 and connection lines 11 and 14 are grounded. In the medium-gain state, the connection line 11 is connected to the bias power supply 204 and connection lines 12 and 14 are grounded. In the low-gain state, the connection line 14 is connected to the bias power supply 204 and connection lines 11 and 12 are grounded.

In FIG. 5, a resister 17 is provided between the base of the fourth transistor 6 and the output of a third bias circuit 9. Reference number 219 indicates a bypass capacitor.

In this configuration, a second transistor 2 is turned on in the high-gain state, the third and fourth transistors are turned on in the medium-gain state, and the fifth and sixth transistors 8 and 6B are turned on in the low-gain state.

In the medium-gain state, the gain in the medium-gain state is controlled by a parallel circuit of a resistor 3 and capacitor 4 and the bias condition of the third transistor 5.

In the low-gain state, the gain is controlled by the bias condition of a resistor 7 and the bias condition of a fifth transistor 8. The resistor 17 allows the collector potential of the first transistor 1 in the medium-gain state to be set to a value lower than that in the low-gain state and allows the base-emitter voltage of the third transistor 5 to be set to a value higher than the base-emitter voltage of the fifth transistor 8.

Thus, the value of a resistor 3 for attenuation in the medium-gain state can be increased and variation in gain in the medium-gain state can be moderated with respect to variations in resistance.

In addition, the same output impedance is kept independently of whether the amplifier is in low-gain state or high-gain state, by making equal the area of each of the second transistor 2, third transistor 5, and fifth transistor. In particular, the total amount of base-collector capacitances of the common base transistors of-both gains paths can be made equal in both gain modes by making the size of the common base transistors used in low-gain and high-gain paths (providing a transistor structure in which the areas of the emitter, base, and collector are equal), thereby eliminating variations in impedance on the output side, which would otherwise be caused by on/off switching.

The second transistor 2 in the high-gain path is turned off in the low-gain mode and medium-gain mode and, as a result, the input impedance of the first transistor 1 becomes high. However, current passes through the fourth transistor 6 or sixth transistor 6B and the impedance of the collector of the first transistor 1 is lowered. Therefore, the input impedance is kept the same both in the high-gain state and low-gain state.

Load Z in the above-described embodiments may be a resistor, an inductor, a parallel circuit of an inductor and capacitor, a parallel circuit of an inductor, capacitor, and resistor, a PNP transistor, or a PMOS.

If the load is a resistor, it may operate at any frequency ranging from DC to a super-radio frequency such as a millimeter wave because it does not have frequency characteristics.

If an inductor, which has frequency characteristics, is used as the load, it does not function as a load at DC and therefore is used especially at a radio-frequency band near a GHz band. Because the inductor has little impedance at DC, it does not lower a power supply voltage. Therefore, a wider operating voltage range of the transistor is available and high linearity can be provided in multistage connection circuits such as a cascode connection, which provides a low power-efficiency.

If a parallel circuit of an inductor and capacitor is used as the load, impedance is infinite at a resonance frequency determined by the values of the inductor and capacitor and the maximum gain can be provided at that frequency. Therefore, this circuit is advantageous to a circuit where BPF characteristic is required. High power-efficiency can also be achieved because the inductor is used.

A parallel circuit of inductor, capacitor, and resistor is used as the load, the stability of the circuit can be improved by lowering the Q factor of the parallel circuit of the inductor and capacitor and intentionally attenuating gains. An active load such as a PNP transistor and PMOS can function as a constant current source thereby allowing such load to function as a current source. Therefore, the active load eliminates the need to add multistage connection of additional power supply transistors and is advantageous in terms of power efficiency.

While the bipolar transistors are used in the above-described embodiments, they may be MOS transistors.

While the variable gain amplifier has been described with respect to the fourth embodiment in which switching among three modes, that is, a high-gain, medium-gain, and low-gain modes, can be performed, similarly switching among more than three gain modes may be performed. In particular, to achieve switching among four gain modes, a serial circuit of attenuator means and the output circuit of a-transistor are connected in parallel with the output circuit of the fifth transistor 8 in FIG. 5 and the selector means SL' is used for the switching.

As described above, the variable gain amplifier according to the present invention has a configuration in which the series circuit of the attenuator means and the output circuit of the third transistor are connected in parallel with the output circuit of the second transistor, the output circuit of the fourth transistor is connected in parallel with the series circuit of the output circuit of the second transistor and the load, the selector means is provided for switching between the high-gain state and low-gain state, the selector means turns off the third and fourth transistors and turns on the second transistor to take a signal, which is amplified by amplification factor found by transconductance gm of the first transistor that determines current flowing in load Z and magnitude of the load Z, from the connecting point in the high-gain state, and turns off the second transistor and turns on the third and fourth transistors to take a signal, which is amplified by amplification factor found by transconductance gm of the first transistor that determines current flowing in load Z and magnitude of the load Z, from the connecting point in the high-gain state. Thus, the gains can be controlled by bias condition of the third transistor and attenuation by the attenuator means. In addition, the area of the first transistor is made equal to the area of the third transistor to keep the output load conditions the same independently of switching between the gains and therefore the output impedance does not change. Although the input impedance of the second transistor becomes high in the gain switching state in which the second transistor is turned off, current passes through the fourth transistor and the impedance of the output circuit of the first transistor is lowered and as a result input impedance is not changed on switching between the gains.

What is claimed is:

1. A variable gain amplifier comprising:
   an output circuit of a second transistor located between an output circuit of a first transistor and a load, for amplifying an input signal at an input of the first transistor to produce an amplified signal at a connecting point between said load and the second transistor, wherein the second transistor is for being turned on and off to switch between gains;
   a series circuit of an attenuator means and an output circuit of a third transistor connected in parallel with an output circuit of the second transistor;
   an output circuit of a fourth transistor connected in parallel with a series circuit of the output circuit of the second transistor and said load; and
   a selector means for switching between a high gain state and a low gain state, wherein
   said selector means is for turning off the third and fourth transistors and for turning on the second transistor to receive an input signal, which is amplified by a first amplification factor due to a first transconductance of the first transistor for determining current flowing in the load and magnitude of the load from said connecting point in the high-gain state, and is for turning off the second transistor and for turning on the third and fourth transistors to receive an input signal, which is amplified by a second amplification factor due to a second transconductance of the first transistor for determining current flowing in the load and magnitude of the load from said connecting point in the low-gain state.

2. The variable gain amplifier according to claim 1, wherein said attenuator means comprises a resistor or a parallel circuit of a resistor and a capacitor.

3. The variable gain amplifier according to claim 1, wherein said attenuator means comprises a field effect transistor.

4. A variable gain amplifier comprising:
   an output circuit of a second transistor located between an output circuit of a first transistor and a load for amplifying an input signal at an input of the first transistor to produce an amplified signal at a connecting point between said load and the second transistor, wherein the second transistor is for being turned on and off to switch between gains;
   a series circuit of a first attenuator means and an output circuit of a third transistor connected in parallel with an output circuit of the second transistor;
   an output circuit of a fourth transistor connected in parallel with a series circuit of the output circuit of the second transistor and said load;
   a series circuit of a second attenuator means and an output circuit of a fifth transistor connected in parallel with an output circuit of the third transistor;
   a selector means is for switching among a high gain state, a medium gain state, and a low gain state, wherein the third and fourth transistors and a fifth transistor are for being turned off and the second transistor is for being turned on to receive an input signal, which is amplified by a first amplification factor due to a first transconductance gin-of the first transistor that for determining current flowing in the load and magnitude of the load, from said connecting point in the high-gain state;

the second and fifth transistors are for being turned off and the third and fourth transistors are for being turned on to receive an input signal, which is amplified by a second amplification factor due to second transconductance of the first transistor for determining current flowing in the load and magnitude of the load from said connecting point in the medium gain state; and the second and third transistors are for being turned off and the fourth and fifth transistors are for being turned on to receive an input signal, which is amplified by a third amplification factor due to third transconductance of the first transistor for determining current flowing in the load and magnitude of the load, from said connecting point in the low-gain state.

5. The variable gain amplifier according to claim 4, further comprising:

an output circuit of a sixth transistor is connected in parallel with a series circuit of the output circuit of the second transistor and said load;

an input circuit of the fourth transistor for receiving through a resistor a bias voltage of an input circuit of the third transistor; and an input circuit of the sixth transistor is connected to an input circuit of the fifth transistor.

* * * * *